United States Patent
Chen et al.

(10) Patent No.: US 9,319,971 B2
(45) Date of Patent: Apr. 19, 2016

(54) FREQUENCY ADJUSTMENT METHOD

(71) Applicant: MStar Semiconductor, Inc., Hsinchu Hsien (TW)

(72) Inventors: Wei-Jen Chen, Taipei (TW); Chi-Yuan Peng, Taipei (TW); Ping-Hung Chiang, Zhubei (TW); Yu-Tai Chang, Hsinchu (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 414 days.

(21) Appl. No.: 13/786,499

(22) Filed: Mar. 6, 2013

(65) Prior Publication Data
US 2013/0237219 A1    Sep. 12, 2013

(30) Foreign Application Priority Data

Mar. 6, 2012   (TW) .............................. 101107537 A

(51) Int. Cl.
H04B 1/18      (2006.01)
H04W 48/16     (2009.01)
H03J 1/00      (2006.01)

(52) U.S. Cl.
CPC ............. *H04W 48/16* (2013.01); *H03J 1/0091* (2013.01)

(58) Field of Classification Search
CPC ................................................ H03J 7/00–7/18
USPC ................ 455/164.1, 164.2, 182.1–186.1, 455/192.1–192.3; 375/344
See application file for complete search history.

(56) References Cited

U.S. PATENT DOCUMENTS

| | | | | |
|---|---|---|---|---|
| 5,422,917 A * | 6/1995 | Scott | ..................... | H03J 7/02 327/3 |
| 6,298,227 B1 * | 10/2001 | Molnar | ..................... | H03J 7/02 455/226.1 |
| 6,438,183 B1 * | 8/2002 | Taura | ................... | H04L 27/2657 375/326 |
| 6,560,298 B1 * | 5/2003 | Froehling | ................. | H03J 7/04 375/344 |
| 6,639,939 B1 * | 10/2003 | Naden | ..................... | H04B 1/707 375/140 |
| 6,801,567 B1 * | 10/2004 | Schmidl | .............. | H04L 27/0014 375/149 |
| 7,012,881 B2 * | 3/2006 | Kim | ..................... | H04L 27/2657 370/208 |
| 7,103,339 B2 * | 9/2006 | Sternberg | ............... | H04B 1/707 375/344 |

(Continued)

OTHER PUBLICATIONS

Taiwan Office Action dated May 5, 2014 citing prior art, 6 pages.

*Primary Examiner* — Edward Urban
*Assistant Examiner* — Rui Hu
(74) *Attorney, Agent, or Firm* — Edell, Shapiro & Finnan, LLC

(57) ABSTRACT

A frequency adjustment method is provided for adjusting a frequency of a reference oscillating signal from an initial oscillation frequency to an adjusted oscillation frequency. The frequency adjustment method includes steps of: dividing a frequency scan section into M scan frequencies; down-converting a signal according to the M scan frequencies to obtain M down-converted signals; performing a correlation calculation operation on the M down-converted signals, respectively, to obtain M correlation results; grouping the M scan frequencies into N frequency groups each containing P selected frequencies, with the P selected frequencies corresponding to P consecutive scan frequencies; performing a group calculation on the N frequency groups, respectively, to obtain N group calculation results; and selecting a target frequency group from the N frequency groups according to the N group calculations results, and obtaining the adjusted oscillation frequency from the target frequency group.

15 Claims, 6 Drawing Sheets

(56) References Cited

U.S. PATENT DOCUMENTS

| | | | |
|---|---|---|---|
| 7,254,161 B2 * | 8/2007 | Boloorian | H04B 1/7075 375/148 |
| 7,269,206 B2 * | 9/2007 | Chen | H04B 1/7083 375/147 |
| 7,299,023 B2 * | 11/2007 | Grieco | H03J 7/02 375/326 |
| 7,308,238 B2 * | 12/2007 | Lee | H03J 7/04 455/136 |
| 7,315,566 B2 * | 1/2008 | Tanno | H04L 27/2675 375/142 |
| 7,693,237 B2 * | 4/2010 | Mehrnia | H04B 1/7156 375/316 |
| 7,733,988 B2 * | 6/2010 | Bachl | H04L 1/0045 375/340 |
| 7,746,963 B2 * | 6/2010 | Chung | H04L 27/2657 375/260 |
| 7,889,782 B2 * | 2/2011 | Gorday | H04B 1/707 375/142 |
| 7,995,680 B2 * | 8/2011 | Wang | H04L 27/2659 375/340 |
| 8,031,818 B2 * | 10/2011 | Lee | H04L 27/266 375/344 |
| 8,059,731 B2 * | 11/2011 | Higuchi | H04L 5/0048 370/215 |
| 8,126,083 B2 * | 2/2012 | Yang | H04L 25/03057 370/208 |
| 8,300,719 B2 * | 10/2012 | Cheng | H04L 27/2675 375/260 |
| 8,325,856 B2 * | 12/2012 | Krishnamoorthi | H04L 27/2675 375/135 |
| RE44,284 E * | 6/2013 | Lee | H04B 1/7077 370/350 |
| 8,503,511 B2 * | 8/2013 | Suberviola | 375/130 |
| 8,605,835 B2 * | 12/2013 | Matsumura | H04L 27/2659 370/464 |
| 8,699,638 B2 * | 4/2014 | Yi | H04L 27/0014 375/142 |
| 8,718,099 B2 * | 5/2014 | Otsuka | H04L 7/041 370/310 |
| 8,744,020 B2 * | 6/2014 | Andgart | H04L 5/0007 375/326 |
| 8,867,443 B2 * | 10/2014 | Qiu | H04B 1/7087 370/328 |
| 2003/0152178 A1 * | 8/2003 | Tanno | H04L 27/2675 375/354 |
| 2003/0193995 A1 * | 10/2003 | Darbel | H03H 17/0254 375/152 |
| 2004/0142712 A1 * | 7/2004 | Rudolf | H04B 1/70735 455/502 |
| 2005/0041762 A1 * | 2/2005 | Lewis | H04B 1/7077 375/343 |
| 2005/0147024 A1 * | 7/2005 | Jung | H04B 1/713 370/203 |
| 2005/0163266 A1 * | 7/2005 | Demir | H04B 1/708 375/344 |
| 2007/0133390 A1 * | 6/2007 | Luo | H04B 1/7083 370/208 |
| 2007/0280098 A1 * | 12/2007 | Bhatt | H04L 27/2656 370/208 |
| 2008/0013650 A1 * | 1/2008 | Engdahl | H04B 1/7087 375/344 |
| 2008/0232513 A1 * | 9/2008 | Wang | H04L 27/2675 375/340 |
| 2009/0034589 A1 * | 2/2009 | Hahm | H04B 1/7075 375/150 |
| 2009/0207949 A1 * | 8/2009 | Yan | H04H 60/50 375/343 |
| 2009/0220014 A1 * | 9/2009 | Higuchi | H04L 5/0048 375/260 |
| 2011/0110466 A1 * | 5/2011 | Conroy | H04B 1/70754 375/340 |

* cited by examiner

FREQUENCY ADJUSTMENT METHOD

This application claims the benefit of Taiwan application Serial No. 101107537, filed Mar. 6, 2012, the subject matter of which is incorporated herein by reference.

BACKGROUND OF THE INVENTION

1. Field of the Invention

The invention relates in general to a frequency adjustment method, and more particularly to a frequency adjustment method for a reference oscillation signal.

2. Description of the Related Art

Wideband Code Division Multiple Access (WCDMA) is a digitized $3^{rd}$-generation mobile communication technique. In a WCDMA system, before a transmitter (a base station) transmits data, narrowband signals are first spread to broadband signals through spread spectrum coding and scrambled through scramble coding, and are then transmitted to a receiver (a cell phone). The data is in a unit of bits, and a spread sequence is in a unit of chips.

To allow the receiver to restore baseband signals transmitted by the transmitter, a cell phone first needs to synchronize with the base station, or else an output of noise waveforms is likely obtained in the baseband signals restored by the cell phone due to unsynchronized timings of the receiver and the transmitter. Hence, a WCDMA system achieves the synchronizations in a code-domain and a time-domain through an initial cell search procedure.

In an initial cell search procedure of a WCDMA system, at the time when a cell phone is activated under unknown situations, the cell phone needs to first search for base stations and locate a base station having the strongest signal strength. Thus, after synchronizing with the timing of the base station and identifying scramble coding utilized by the base station, the cell phone is able to correctly communicate with the base station and restore the original baseband signals. For identification purposes, $f_b$ represents a frequency of the baseband signals, and $f_c$ represents a frequency of carrier signal.

A certain error is usually present in an oscillator adopted in a cell phone or at a base station, such that a carrier frequency offset (CFO) exists between the frequencies of the two. The carrier frequency offset is also referred to as a frequency error $f_{error}$. Therefore, to allow the cell phone to normally receive signals, a frequency $f_{ref}$ of a reference oscillation signal generated by a local oscillator of the cell phone ought to be adjusted, so that the frequency $f_{ref}$ of the reference oscillation signal can better approximate the frequency $f_c$ of the carrier signal.

In an initial cell search procedure of a WCDMA system, once an absolute radio-frequency channel number (ARFCN) is selected, correction is performed on the frequency of the reference oscillation signal generated by the local oscillator. A WCDMA system has a tolerable error range of approximately 3-13 ppm. That is, when the frequency of the carrier signal is 2 GHz, the tolerable frequency error range between the frequency $f_{ref}$ of the reference oscillation signal and the frequency $f_c$ of the carrier signal is 6 kHz to 26 kHz.

Thus, in the initial cell search procedure, the frequency synchronization between the reference oscillation signal of the cell phone and the carrier signal of the base station, and an appropriate correction on the received signals to generate correct down-converted signals, are rather crucial links allowing normal operations of a WCDMA system.

In the prior art, at the same time when performing the initial cell search procedure, a coarse automatic frequency control (AFC) is adopted to perform an initial frequency retrieval. The frequency $f_{ref}$ of the reference oscillation signal generated by the local oscillator is corrected according to a result of the initial frequency retrieval, so as to adjust the frequency error $f_{error}=f_c-f_{ref}$ between the frequency $f_{ref}$ of the reference oscillation signal and the frequency $f_c$ of the carrier signal to be within ±3 ppm.

According to a planning of a WCDMA system, a code frame has a length of 10 ms, and has 15 slots each containing 2560 subcodes. To facilitate the process of the initial cell search procedure for the cell phone, the WCDMA system provides a primary synchronization channel (PSCH) for assisting the cell phone to complete the slot synchronization. A length of the PSCH is only ¹⁄₁₀ of that of an original slot, and the slots at other positions do not include any messages or data. Therefore, only the first 256 subcodes of each slot contain a set of designed primary synchronization sequence.

Since all base stations utilize the same PSCH sequence, and the cell phone is also stored in advance with a PSCH sequence, whether the cell phone correctly receives the PSCH sequence is then a method that the receiver adopts for positioning a slot boundary. Further, the receiver performs a correlation calculation on the PSCH sequence and determines the frequency error $f_{error}$ according to the correlation result.

As the frequency error $f_{error}$ between the reference oscillation signal and the carrier signal gets larger, an output value of a PSCH correlator becomes smaller. Hence, an approach of utilizing a size of an output of a PSCH correlator for determining the frequency error $f_{error}$ is often implemented in the initial frequency retrieval of the WCDMA system.

FIG. 1A shows schematic diagram of signal transmission and signal processing of a receiver in a WCDMA system. The left of the diagram shows a baseband signal of a base station and a carrier signal generated by a base station oscillator 106.

Through a mixer 102, a baseband signal is up-converted through the carrier signal to generate a transmission signal. The mixer 102 may be regarded multiplying two signals. After the frequency $f_b$ of the baseband signal passes through the mixer 102, a mixed signal having a frequency $f_b \pm f_c$ is generated at an output terminal of the mixer 102. Through a filter (not shown), the mixed signal is transmitted as $f_b + f_c$ or $f_b - f_c$. The transmission signal is transmitted from an antenna of the base station via a mobile communication network 10 and then received by an antenna of the cell phone.

When the transmission signal is received as a received signal by the cell phone, a mixer 101 of the cell phone down-coverts the received signal by use of a reference oscillation signal generated by a local oscillator 105.

Theoretically, the frequency $f_{ref}$ of the reference oscillation signal equals the frequency $f_c$ of the carrier signal, and so the baseband signal can be restored in intact from the received signal. However, quite the contrary, the signal obtained after down-conversion by use of the reference oscillation signal is different from the baseband signal initially transmitted at the transmitter. Differences between the down-converted signal at the receiver and the baseband signal at the transmitter may be accounted by variations in the transmission process and the signal processing.

For example, in the transmission process, a baseband signal x(n) transmitted from the base station may be affected by noises or signal interference (N). Assuming the baseband signal is x(n), and a signal restored by the mixer 101 of the cell phone is y(n), the signal outputted by the mixer 101 is theoretically a combination of the baseband signal x(n) and the interference (N).

Apart from the interference in the transmission process, the frequency $f_{ref}$ of the reference oscillation signal is not entirely the same as the frequency $f_c$ of the carrier signal generated by the oscillator of the base station, and so an error exists between the two. Assuming the frequency $f_{ref}$ of the reference oscillation signal generated by the local oscillator is an initial oscillation frequency $f_{orig}$ ($f_{ref}=f_{orig}$), and the frequency of the carrier signal is $f_c$, a demodulated signal y(n) is affected by the frequency error $f_{error}$ ($f_{error}=f_{ref}-f_c=f_{orig}-f_c$).

To determine the frequency error $f_{error}$ between the reference oscillation signal and the carrier signal, approaches for correcting the frequency of the reference oscillation signal are categorized into coarse correction and fine correction.

The coarse correction on the frequency is to perform an initial correction on the frequency $f_{ref}$ of the reference oscillation signal so that the frequency error $f_{error}$ is reduced to within a frequency scan step $\Delta f$. After performing the coarse correction, a fine correction is performed on the frequency $f_{ref}$ of the reference oscillation signal. The coarse tuning on the frequency shall be discussed below.

The reference oscillation signal generated by the local oscillator needs to further undergo the fine correction after the coarse correction. Therefore, an unacceptable frequency error may still be resulted to lead to an imprecise calibration if an unsatisfactory result is rendered by the preceding frequency coarse correction. A detection rate represents a rate whether the frequency error $f_{error}$ can be adjusted and corrected to zero in the subsequent fine correction.

In a conventional frequency coarse correction, a frequency scan section is divided into a plurality of scan frequencies $f_i$, and the scan frequencies $f_i$ are utilized in sequence for testing. The scan frequency $f_i$ represents an $i^{th}$ scan frequency in the frequency scan section.

A predetermined frequency scan step $\Delta f$ exists between the scan frequencies $f_i$ of the frequency scan section, and a correlation result $y_i$ may be obtained according to each of the scan frequencies $f_i$ in the frequency scan section. By comparing the correlation results $y_i$, a maximum value $y_{max}$ of the correlation results $y_i$ can be obtained. Further, when the correlation results $y_i$ is a maximum value, the corresponding scan frequency $f_i$ enables the frequency error $f_{error}$ to approximate a minimum value that the frequency coarse correction can achieve.

More specifically, after comparing the values of the correlation results $y_i$, the maximum value $y_{max}$ can obtained to accordingly obtain the corrected oscillation frequency ($f_{ref}=f_i$).

Equations shall be given for deriving the above approach. A received signal r(t) is expressed by Equation (1).

$$r(t)=\alpha(t)s(t-t_b)\exp(j2\pi f_c t)+n(t) \quad \text{Equation (1)}$$

In Equation (1), s(t) represents a primary synchronization sequence, which is the first 256 chips of a slot; $\alpha(t)$ represents Rayleigh fading, and has a value assumed to be frequency-flat for simplification purposes; $t_b$ represents a timing offset between a system timing and an air slot boundary; $f_c$ represents a frequency of the carrier signal; and n(t) represents a sum of noise and other interferences.

Next, the received signal r(t) is down-converted through the mixer 101 according to the frequency $f_{ref}$ of the reference oscillation signal. It should be noted that, the frequency $f_{ref}$ of the reference oscillation signal changes according to different scan frequencies $f_i$ ($f_{ref}=f_i$).

More specifically, the frequency $f_{ref}$ of the reference oscillation signal is an initial oscillation frequency $f_{orig}$ at the beginning, and the initial oscillation frequency $f_{orig}$ does not equal the frequency $f_b$ of the carrier signal. In response to different scan frequencies $f_i$, the frequency $f_{ref}$ of the reference oscillation signal for down-converting the received signal through the mixer also changes, such that output results of the down-converted received signal from the mixer 101 also change as the scan frequency $f_i$ changes.

Since the scan frequency $f_i$ is a known value, the correlation results corresponding to different scan frequencies $f_i$ can also be obtained. In Equation (2), the correlation result $y_i$ represents a situation that an output of the PSCH correlator is a maximum in different slot boundary candidates $t_m$.

$$y_i = \max_{t_m} \left| \int_{t_i}^{t_i+T} r(t) \times s^*(t-t_m)\exp(-j2\pi f_i t) dt \right| \quad \text{Equation (2)}$$

Wherein, $t_i$ is a starting time of the correlation of the scan frequency $f_i$. As observed from $t_i$, a signal for calculating the correlation may vary as the scan frequency $f_i$ changes. T represents an integration period, which is substantially equal to a WCDMA slot.

It is concluded from Equation (2) that, given the Rayleigh fading $\alpha(t)$ is a constant; the correlation result $y_i$ outputted by the PSCH correlator has a maximum value when the scan frequency $f_i$ is most approximate to the frequency $f_c$ of the carrier signal. Therefore, the PSCH correlation calculation is performed on all of the scan frequencies $f_i$, and then it is determined which of the scan frequency is most approximate to the frequency of the carrier signal (fi≈fc) according to the correlation results. Hence, the frequency $f_{ref}=f_i$ of the reference oscillation signal can be obtained according to Equation (3).

$$\hat{f}_i = \max_{f_i}\{y_i\} \quad \text{Equation (3)}$$

Once the scan frequency $f_i$ that is most approximate to the frequency $f_c$ of the carrier signal is obtained, the conventional solution then utilizes the scan frequency $f_i$ to correct the frequency $f_{ref}$ of the reference oscillation signal. That is, the reference oscillation signal generated by the local oscillator 107 is adjusted from the initial oscillation frequency $f_{ref}=f_{orig}$ to the scan frequency $f_{ref}=f_i$ corresponding to the maximum correlation result.

That is to say, in the prior art, details of estimating the frequency error $f_{error}$ between the initial oscillation frequency $f_{orig}$ and the carrier frequency $f_c$ according to the calculation results of the PSCH correlator are as below.

The frequency scan section is first divided into a plurality of scan frequencies $f_i$. The different scan frequencies $f_i$ are respectively utilized as the frequency $f_i$ of the reference oscillation signal, and it is observed which of the scan frequencies $f_i$ corresponds to a maximum value of the correlation results $y_i$ generated by the PSCH correlator.

Therefore, in the prior art, for a specific scan frequency $f_i$ corresponding to the maximum value of the correlation results $y_i$ generated by the PSCH correlator, the specific scan frequency $f_i$ is determined as the frequency most approximate to the carrier frequency $f_c$ in the frequency scan section. The frequency $f_{ref}$ of the reference oscillation signal generated by the local oscillator is then adjusted from the initial oscillation frequency $f_{orig}$ to the scan frequency $f_i$ (i.e., the adjusted oscillation frequency).

For example, the smallest scan frequency and the largest scan frequency in the frequency scan section are defined as having a difference range of −15.4 ppm to +15.4 ppm with the frequency $f_{orig}$ of the initial oscillation signal. A step size of the frequency scan step $\Delta f$ in the range is 1.4 ppm. Thus, within the frequency scan section between −15.4 ppm to +15.4 ppm centered by the frequency $f_{ong}$ of the initial oscillation signal, the frequency scan section includes a total of (15.4*2)/1.4+1=23 scan frequencies when 1.4 ppm is a range of one frequency scan step Δf.

FIG. 1B shows a schematic diagram of a sequential frequency scanning approach in the prior art. For simplified illustrations, not all the 23 scan frequencies in the frequency scan section are depicted. Instead, the different scan frequencies are indicated in different numbers, and the calculation results obtained by the PSCH correlator from the scan frequencies are indicated in corresponding numbers. For example, a first correlation result y1 is obtained according to a first scan frequency f1, a second correlation result y2 is obtained according to a second scan frequency f2, and so forth.

In simple words, in a convention solution, scanning is performed by different scan frequencies $f_i$ within a frequency scan section. The approach of testing and verifying the change in scanning the scan frequencies $f_i$ one after another is utilized for frequency coarse correction of the reference oscillation signal.

However, the detection rate of the coarse correction based on sequentially calculating and comparing the correlation results of the scan frequencies may be unsatisfactory, such that the frequency error $f_{error}$ may be greater than the frequency scan step Δf. That is to say, the conventional solution of coarse correction does not guarantee that the frequency error $f_{error}$ can be reduced to 0 in the subsequent fine correction.

When adopting the above conventional solution that estimates the frequency most approximate to the frequency of the carrier signal for adjusting the oscillation frequency, a reason for not being able to correctly determine the frequency error in the fine correction is that, it is possible that many different scan frequencies $f_i$ correspond to larger correlation results $y_i$, or a maximum absolute value at the same time corresponds to two scan frequencies that both have the maximum correlation results although being two extreme values with a great difference in between (e.g., f1 and f23). Further, as Rayleigh fading αt changes along with time, an outcome of the frequency error $f_{error}$ estimated by Equation (3) is not at all ideal.

It is even discovered through simulation results that, the frequency correction results may diverge when performing the coarse correction on the reference oscillation signal according to the above conventional solution, such that an appropriate value for correcting the oscillation frequency is unlikely to be determined. Therefore, the conventional solution of scanning all the scan frequencies $f_i$ within the frequency scan section and directly determining and adjusting the reference oscillation signal according to the correlation results faces certain drawbacks.

SUMMARY OF THE INVENTION

The invention is directed to a frequency adjusting method applied to a reference oscillation signal to adjust the reference oscillation frequency from an initial oscillation frequency to an adjusted oscillation frequency. The method includes steps of: dividing a frequency scan section into a M scan frequencies; down-converting a signal according to the M scan frequencies to obtain M down-converted signals; performing a correlation calculation on the M down-converted signals, respectively, to obtain M correlation results; grouping the M scan frequencies into N frequency groups, each N frequency group including P selected frequencies corresponding to P consecutive scan frequencies in the frequency scan section; performing a group calculation on the N frequency groups, respectively, to obtain N group calculation results; and selecting a target frequency group from the N frequency groups according to the N group calculation results, and obtaining the adjusted oscillation frequency from the target frequency group.

The above and other aspects of the invention will become better understood with regard to the following detailed description of the preferred but non-limiting embodiments. The following description is made with reference to the accompanying drawings.

DETAILED DESCRIPTION OF THE INVENTION

According to a concept of the disclosure, a method of utilizing frequency groups as a calculation basis for frequency coarse tuning is provided. Embodiments shall be given below with reference to a flowchart for demonstrating the method of the disclosure.

Figure 2:
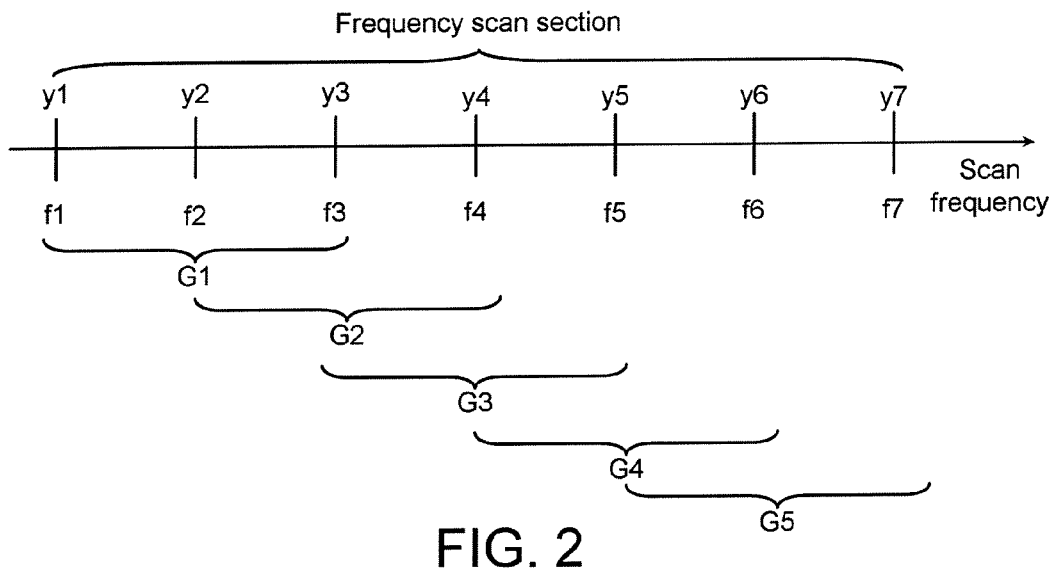
FIG. 2 a schematic diagram of utilizing five frequency groups as a calculation basis for frequency coarse tuning according to a preferred embodiment.

FIG. 2 shows a schematic diagram of utilizing five frequency groups as a calculation basis for frequency coarse tuning according to a preferred embodiment.

In this preferred embodiment, a frequency scan section is divided into seven scan frequencies f1 to f7. A correlation calculation is performed on the scan frequencies f1 to f7 in the frequency scan section by a PSCH correlator to obtain a first correlation result y1 according to a first scan frequency f1, a second correlation result y2 according to a second scan frequency f2, a third correlation result y3 according to a third scan frequency f3, a fourth correlation result y4 according to a fourth scan frequency f4, a fifth correlation result y5 according to a fifth scan frequency f5, a sixth correlation result y6 according to a sixth scan frequency f6, and a seventh correlation result y7 according to a seventh scan frequency f7.

In this preferred embodiment, every three consecutive scan frequencies are grouped into a frequency group as frequency options in the frequency group. Thus, as observed from FIG. 2, the seven scan frequencies ($f_i$, i=1~7) are grouped into five frequency groups ($G_j$, j=1~5). Being different from the conventional solution, the correlation results y1, y2, y3, y4, y5, y6 and y7 obtained according to the scan frequencies f1, f2, f3, f4, f5, f6 and f7 are not directly compared. Rather, weighted calculations are performed the correlation results y1, y2, y3, y4, y5, y6 and y7, the frequency group $G_i$ is utilized as a basic unit, and the weighted accumulation results obtained according to the frequency groups $G_i$ are compared.

For example, the scan frequencies in FIG. 2 are grouped into five frequency groups G1, G2, G3, G4 and G5, with each frequency group $G_i$ expressed in a curly bracket for indicating the included scan frequencies $f_i$. In this preferred embodiment, assume each frequency group $G_i$ includes three selected frequencies F1, F2 and F3. It should be noted that, a quantity (N) of the frequency groups $G_i$ and a quantity (P) of the selected frequencies included in each frequency group may be modified based on actual system design requirements.

For example, the selected frequencies $F_k$ in the frequency group $G_i$ are sequentially numbered from low to high. To distinguish the selected frequency numbers in the frequency groups $G_j$, $F_k$ (k=1, 2, 3) is utilized to express the selected frequencies in a same frequency scan group, whereas $f_i$ (i=1, 2, 3, 4, 5, 6, 7) is utilized to express the scan frequencies in the entire frequency scan section.

The first selected frequency F1, the second selected frequency F2 and the third selected frequency F3 included in the first frequency group G1 respectively correspond to the first scan frequency f1, the second scan frequency f2 and the third scan frequency f3 in the frequency scan section.

The first selected frequency F1, the second selected frequency F2 and the third selected frequency F3 included in the second frequency group G2 respectively correspond to the second scan frequency f2, the third scan frequency f3 and the fourth scan frequency f4 in the frequency scan section.

The first selected frequency F1, the second selected frequency F2 and the third selected frequency F3 included in the third frequency group G3 respectively correspond to the third scan frequency f3, the fourth scan frequency f4 and the fifth scan frequency f5 in the frequency scan section.

The first selected frequency F1, the second selected frequency F2 and the third selected frequency F3 included in the fourth frequency group G4 respectively correspond to the fourth scan frequency f4, the fifth scan frequency f5 and the sixth scan frequency f6 in the frequency scan section.

The first selected frequency F1, the second selected frequency F2 and the third selected frequency F3 included in the fifth frequency group G5 respectively correspond to the fifth scan frequency f5, the sixth scan frequency f6 and the seventh scan frequency f7 in the frequency scan section.

It is seen from the above description that, the selected frequencies F1, F2 and F3 included in the frequency groups G1, G2, G3, G4, G5, G6 and G7 sequentially correspond to the scan frequencies f1, f2, f3, f4, f5, f6 and f7 from low to high.

For example, the selected frequencies F1, F2 and F3 included in the first frequency group G1 are the three consecutive scan frequencies f1, f2 and f3 starting from the first scan frequency f1; and the selected frequencies F1, F2 and F3 included in the second frequency group G2 are the three consecutive scan frequencies f2, f4 and f4 starting from the second scan frequency f2. The selected frequencies F1, F2 and F3 included in other frequency groups are similarly characterized.

A weighted calculation operation is performed on the correlation results of the frequency groups according to the scan frequencies corresponding to the frequency groups G1, G2, G3, G4, G5, G6 and G7. In this preferred embodiment, three different weightings w1, w2 and w3 are assigned, and correlation results Y1, Y2 and Y3 are obtained according to the three selected frequencies F1, F2 and F3 included in the frequency group $G_i$.

For example, the first weighting w1 corresponds to the correlation result Y1 obtained according to the first selected frequency F1 in the frequency group $G_i$; the second weighting w2 corresponds to the correlation result Y2 obtained according to the second selected frequency F2 in the frequency group $G_i$; and the third weighting w3 corresponds to the correlation result Y3 obtained according to the third selected frequency F3 in the frequency group $G_i$.

Therefore, in this preferred embodiment, a corresponding relationship among the weightings, the numbers of the selected frequencies in the frequency groups, and the correlation results corresponding to the selected frequencies are represented as: (w1, F1, Y1), (w2, F2, Y2) and (w3, F3, Y3). Values of the weightings can be flexibly defined, e.g., the second weighting w2 is the largest, and the first weighting w1 equals the third weighting w3 (w1=w3).

According to the concept of the disclosure, a corresponding weighted accumulation operation is performed on a correlation result $Y_k$ obtained from the selected frequency $F_k$ in each frequency group $G_j$ according to a corresponding weighting $W_k$. After obtaining the weighted accumulation result $SY_j$ corresponding to each frequency group $G_j$, a target frequency group having a maximum value is determined. Wherein, j represents the number of the frequency groups, and k represents the corresponding number of the selected frequency in a same frequency group.

Taking FIG. 2 for example, the weighted accumulation results $SY_j$ corresponding to each frequency group is defined as: $SY_j=w1*Y1+w2*Y2+w3*Y3$, where j=1, 2, 3, 4, 5.

The quantity of the selected frequencies included in the frequency groups may vary, and so the definition for the weighted accumulation result may change accordingly.

Assuming the quantity of the scan frequencies in each frequency scan section is as shown in FIG. 2 (f1~f7), and each frequency group includes four selected frequencies F1, F2, F3 and F4, four frequency scanning groups G1, G2, G3 and G4 are then obtained. At this point, the weighted accumulation results ($SY_j$, j=1, 2, 3, 4) corresponding to the frequency scanning groups ($G_j$, j=1, 2, 3, 4) can be expressed according to the weightings and the correlation results of the scan frequencies as: $SY_j=w1*Y1+w2*Y2+w3*Y3+w4*Y4$.

Wherein, $Y_1$ represents a first selected frequency correlation result obtained according to the scan frequency corresponding to the first selected frequency $F_1$ in the frequency group $G_j$, $Y_2$ represents a second selected frequency correlation result obtained according to the scan frequency corresponding to the second selected frequency $F_2$ in the frequency group $G_j$, $Y_3$ represents a third selected frequency correlation result obtained according to the scan frequency corresponding to the third selected frequency $F_3$ in the frequency group $G_j$, and $Y_4$ represents a fourth selected frequency correlation result obtained according to the scan frequency corresponding to the fourth selected frequency $F_4$ in the frequency group $G_j$.

Similarly, when the frequency group $G_j$ includes four selected frequencies F1, F2, F3 and F4, the scan frequencies included in each frequency group $G_j$ have different combinations according to the different correspondences between the selected frequencies of each frequency group $G_j$ and the scan frequencies. For example, the four selected frequencies F1, F2, F3 and F4 in the first frequency group G1 correspond to four scan frequencies f1, f2, f3 and f4, the four selected frequencies F1, F2, F3 and F4 in the second frequency group G2 correspond to four scan frequencies f2, f3, f4 and f5, and so forth.

In continuation of the preferred embodiment in FIG. 2, for each of the selected frequencies included in each frequency group $G_j$, a weighted accumulation operation is performed according to $SY_k=w_1*Y_1+w_2*Y_2+w_3*Y_3$ where j=1, 2, 3, 4, 5.

Thus, a first weighted accumulation result SY1 is obtained according to the correlation results y1, y2 and y3 of the scan frequencies f1, f2 and f3 corresponding to the selected frequencies in the first frequency group G1; a second weighted accumulation result SY2 is obtained according to the correlation results y2, y3 and y4 of the scan frequencies f2, f3 and f4 corresponding to the selected frequencies in the second frequency group G2; a third weighted accumulation result SY3 is obtained according to the correlation results y3, y4 and y5 of the scan frequencies f3, f4 and f5 corresponding to the selected frequencies in the third frequency group G3; a fourth weighted accumulation result SY4 is obtained according to the correlation results y4, y5 and y6 of the scan frequencies f4, f5 and f6 corresponding to the selected frequencies in the fourth frequency group G4; and a fifth weighted accumulation result SY5 is obtained according to the correlation results y5, y6 and y7 of the scan frequencies f5, f6 and f7 corresponding to the selected frequencies in the fifth frequency group G5.

The calculations for the weighted accumulation result corresponding to the frequency groups are expressed as:

the first weighted accumulation result SY1 is obtained according to the first frequency group G1, where $SY1=w1*y1+w2*y2+w3*y3$;
the second weighted accumulation result SY2 is obtained according to the second frequency group G2, where $SY2=w1*y2+w2*y3+w3*y4$;
the third weighted accumulation result SY3 is obtained according to the third frequency group G3, where $SY3=w1*y3+w2*y4+w3*y5$;
the fourth weighted accumulation result SY4 is obtained according to the fourth frequency group G4, where $SY4=w1*y4+w2*y5+w3*y61$; and
the fifth weighted accumulation result SY5 is obtained according to the fifth frequency group G5, where $SY5=w1*y5+w2*y6+w3*y7$.

The weighted accumulation results are then compared, and a maximum value is selected. The frequency group corresponding to the maximum weighted accumulation result is selected as the target frequency group.

Assuming a comparison result of the weighted accumulation results is that, the first weighted accumulation result SY1 has the maximum value, the first frequency group G1 is selected as the target frequency group, and the scan frequency corresponding a central selected frequency F2 in the first frequency group G1 is utilized as an adjusted oscillation frequency. Similarly, when a comparison result of the weighted accumulation results is that, the first weighted accumulation result SY2 has the maximum value, the second frequency group G2 is selected as the target frequency group, and the scan frequency corresponding a central selected frequency F2 in the first frequency group G2 is utilized as an adjusted oscillation frequency.

It is to be noted that, in this preferred embodiment, the central selected frequency is the second selected frequency F2 in the middle since the quantity of the selected frequencies included in each frequency group is three (F1, F2 and F3). However, the number of the selected frequency corresponding to the central selected frequency may be different as the quantity of the selected frequencies included in the scanning group changes.

For example, when the scan frequency group $G_j$ includes five selected frequencies, the third selected frequency F3 in the middle serves as the central selected frequency. Further, when the scan frequency group $G_j$ includes four selected frequencies, an average of the scan frequencies corresponding to the second selected frequency F2 and the third selected frequency F3 is utilized as the adjusted oscillation frequency. The approach for determining the adjusted oscillation frequency for other quantities of scan frequencies can be similarly deduced.

As described with the above preferred embodiment, the present disclosure provides a frequency adjustment method for adjusting a reference oscillation signal from an initial frequency to an adjusted oscillation frequency.

Taking FIG. 2 for example, the frequency adjustment method according to the preferred embodiment includes steps of: dividing a frequency scan section into seven scan frequencies f1, f2, f3, f4, f5, f6 and f7, down-converting a signal according to the seven scan frequencies to obtain seven down-converted signals; performing a correlation calculation operation on the seven down-converted signals, respectively, to obtain seven correlation results y1, y2, y3, y4, y5, y6 and y7; grouping the seven scan frequencies into five frequency groups G1, G2, G3, G4 and G5 each including three selected frequencies, with the selected frequencies of each frequency group corresponding to three consecutive scan frequencies in the frequency scan section; performing a group calculation on the five frequency groups G1, G2, G3, G4 and G5, respectively, to obtain five group calculation results SY1, SY2, SY3, SY4 and SY5; and selecting a target frequency group from the five frequency groups G1, G2, G3, G4 and G5 according to the five group calculation results SY1, SY2, SY3, SY4 and SY5, and obtaining the adjusted oscillation frequency from the scan frequencies in the target frequency group.

Figure 3:
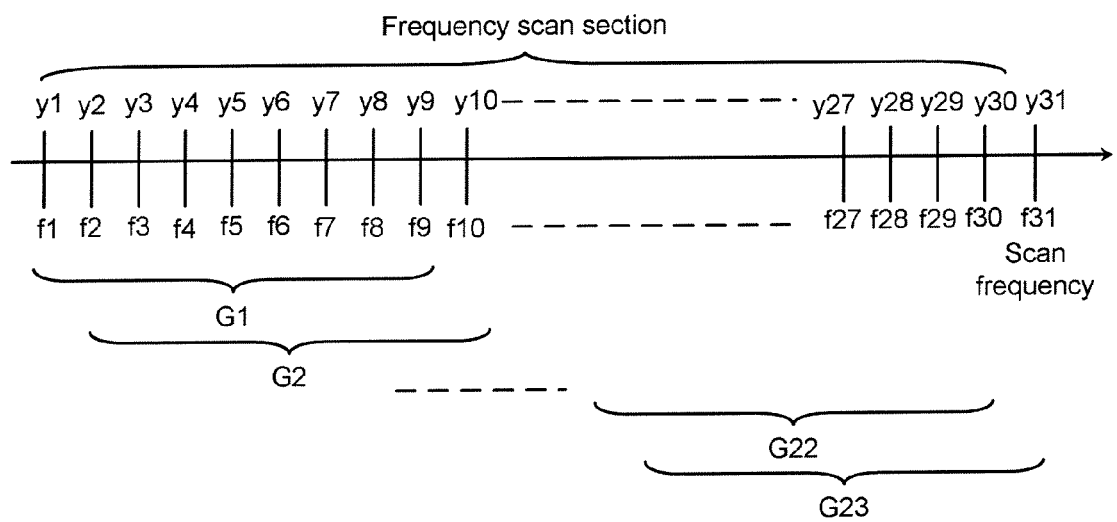
FIG. 3 a schematic diagram of utilizing 23 frequency groups as a calculation basis for frequency coarse tuning according to a preferred embodiment.

To further illustrate the concept of the disclosure, FIG. 3 shows another preferred embodiment. With reference to FIG. 3, a coarse tuning method for obtaining a preferred detection rate by utilizing the frequency group G as a basis of providing the adjusted oscillation frequency shall be described.

Figure 1A:
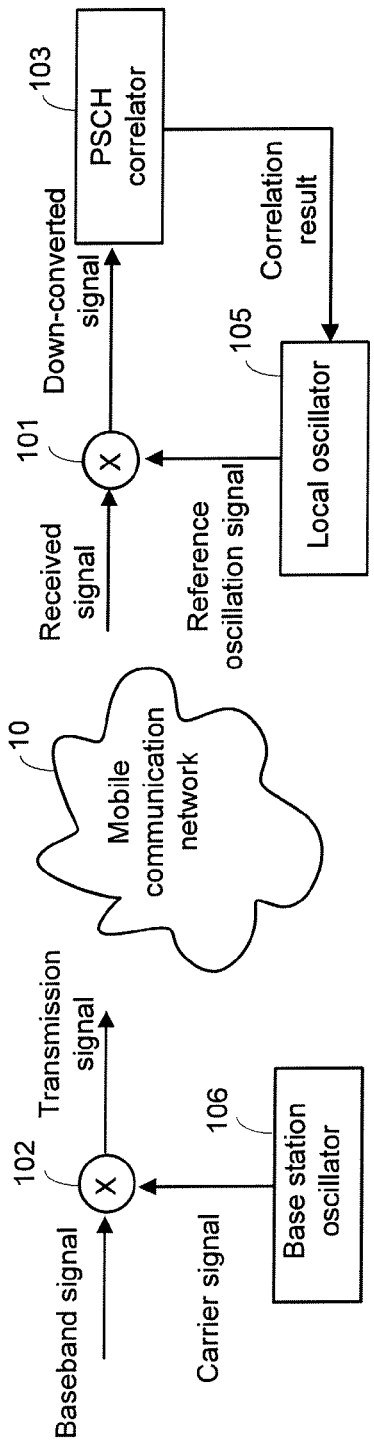
FIG. 1A is a schematic diagram of signal transmission and signal processing of a receiver in a WCDMA system.
Figure 1B:
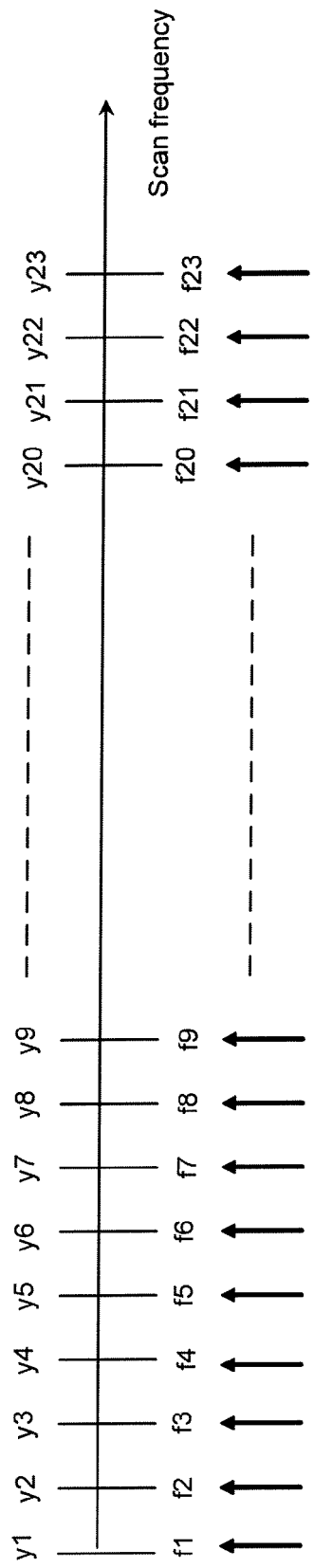
FIG. 1B is a schematic diagram of a sequential frequency scanning approach in the prior art.

For comparing with the prior art, in FIG. 3, 1.4 ppm is also utilized as the frequency scan step Δf as in FIG. 1B. A main difference is that the frequency scan section in FIG. 3 is divided into 31 scan frequencies. Therefore, the range of the frequency scan section is greater than the frequency scan section in the prior art.

It is discovered by further comparison that, the frequency scan section in FIG. 1B covers positive and negative 11 frequency scan steps Δf from the initial oscillation frequency (1.4 11=15.4). That is to say, the scan frequencies are between (initial oscillation frequency−15.4 ppm) and (initial oscillation frequency+15.4 ppm). On the other hand, the frequency scan section in FIG. 3 covers positive and negative 15 frequency scan steps Δf from the initial oscillation frequency (1.4*15=21). That is to say, the scan frequencies are between (initial oscillation frequency−21 ppm) and (initial oscillation frequency+21 ppm).

It is known from the above description that, on the basis of the frequency group $G_i$, the central selected frequency of the frequency group $G_i$ is selected as the adjusted oscillation frequency. Thus, border scan frequencies (e.g., f1 and f7, depending on the quantity of the selected frequencies included in the frequency group) in the frequency scan section are not chosen as the adjusted oscillation frequency. Therefore, when a difference between an expected oscillation frequency and the initial oscillation frequency is between −15.4 ppm and 15.4 ppm, the range of the frequency scan section actually implemented by the present disclosure is in fact greater than the error frequency range −15.4 ppm to 15.4 ppm.

Referring to FIG. 3 showing a schematic diagram of another preferred embodiment, 23 frequency groups are utilized as a basis for frequency coarse tuning calculations. In this preferred embodiment, the frequency scan section is divided into M (M=31) scan frequencies. Compared to the previous preferred embodiment, given that the range of the frequency scan section is maintained the same and the quantity of the included scan frequencies $f_i$ is larger, it means that the frequency scan step Δf is smaller.

In this preferred embodiment, assume each of the frequency groups includes P (P=9) selected frequencies, which correspond to nine consecutive frequencies in the frequency scan section. F1 to F9 represent the nine selected frequencies in each of the frequency groups. A fifth selected frequency F5 in each frequency group serves as the central selected frequency, whereas the remaining frequencies F1, F2, F3, F4, F6, F7, F8 and F9 are regarded as slave selected frequencies. It should be noted that the quantity of the selected frequencies of each frequency group is not limited to the above quantity but can be adjusted according to actual requirements.

For the above scan frequencies, the corresponding correlation results are respectively a first selected frequency correlation result Y1, a second selected frequency correlation result Y2, a third selected frequency correlation result Y3, a fourth selected frequency correlation result Y4, a fifth selected frequency correlation result Y5, a sixth selected frequency correlation result Y6, a seventh selected frequency correlation result Y7, an eighth selected frequency correlation result Y8, and a ninth selected frequency correlation result Y9.

After obtaining all the correlation results, weighted calculation weightings w1, w2, w3, w4, w5, w6, w7, w8 or w9 are respectively assigned to the selected frequencies in the frequency groups according to the sequence of the scan frequencies in the frequency scanning groups.

Similarly, the first weighted calculation weighting w1 corresponds to the first selected frequency correlation result Y1 in each frequency group, the second weighted calculation weighting w2 corresponds to the second selected frequency correlation result Y2, and so forth. Hence, a weighted accumulation result $SY_i$ can be obtained as in Equation (4):

$$SY_i = \sum_{j=1}^{o} y_j \times w_j \qquad \text{Equation (4)}$$

Wherein, $w_j$ represents a weighting corresponding to the correlation result $y_j$.

The output F of the correlator can be approximated by a normally distributed random variable, especially when the SNR is larger. In other words, since the output $y_j$ of the correlator is approximately proportional to $\exp(-((y_1 - E[y_1])^2 + \ldots + (y_j - E[y_j])^2 + \ldots + (y_o - E[y_o])^2))$, the scan frequency $f_i$ corresponding to a maximum value of the weighted accumulation result $$SY_j = \sum_{j=1}^{O} y_j E[y_j]$$

can be obtained according to calculations of different scan frequencies.

The method of the present disclosure estimates the adjusted oscillation frequency according to the scan frequency corresponding to the maximum weighted accumulation result. That is, as the weighted accumulation result $SY_i$ corresponding to the frequency group $G_i$ gets larger, it means that the selected frequencies included in the group are more approximate to the actual frequency of the carrier signal. Therefore, the estimated adjusted oscillation frequency corresponds to a scan frequency in the frequency group having the maximum weighted accumulation result. Equation (5) represents a maximum likelihood estimator:

$$\hat{f}_o = \max_{f_i}\{SY_i\} \qquad \text{Equation (5)}$$

According to the above description, the concept of utilizing the frequency groups in the present disclosure can be appreciated through illustrations associated with FIGS. 2 and 3. Details for implementing the above concept shall be further given with reference to FIGS. 4A and 4B.

Figure 4A:
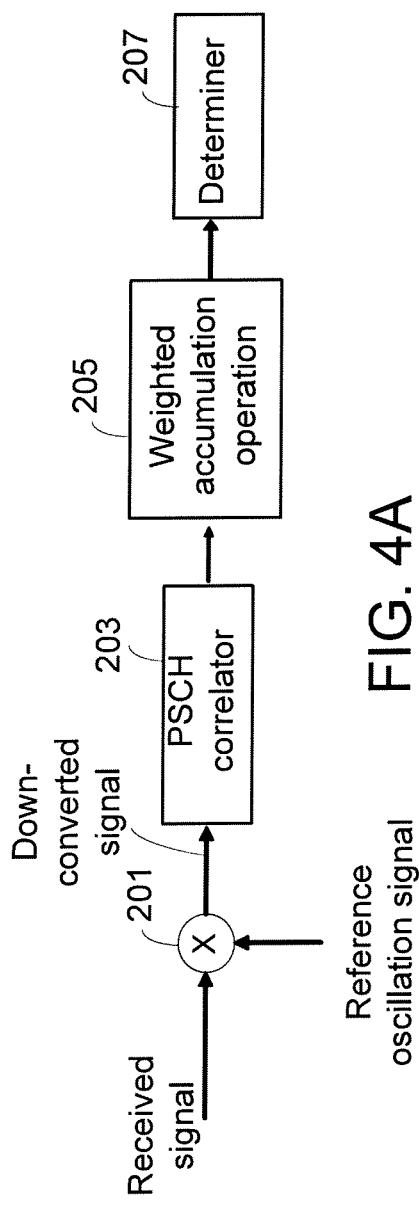
FIG. 4A is a schematic diagram of utilizing frequency groups as a basis for obtaining a coarse-tuned adjusted oscillation frequency by a first implementation approach according to the concept of the disclosure.

FIG. 4A shows a schematic diagram of utilizing frequency groups as a basis for obtaining a coarse-tuned adjusted oscillation frequency by a first implementation approach according to the concept of the disclosure.

A signal is down-converted according to a reference oscillation signal by a mixer 201, and a frequency $f_{ref}$ of the reference oscillation signal is adjusted from an initial oscillation frequency $f_{ref}=f_{orig}$ to an adjusted oscillation frequency $f_{ref}=f_i$.

The mixer 201 outputs a down-converted result to a PSCH correlator 203. Since a frequency scan section is divided into M scan frequencies, the reference oscillation signal is changed to the M scan frequencies. The signal is down-converted according to the M scan frequencies to obtain M down-converted received signals.

A correlation calculation operation is performed on the down-converted signals by the PSCH correlator 203 to obtain M correlation results. The frequency scan section is grouped into N frequency groups according to the M correlation results. Each of the frequency groups includes P selected frequencies, and the P selected frequencies are P consecutive scan frequencies in the frequency scan section. According to the frequency groups, a group calculation operation (e.g., the weighted accumulation operation 205) is performed on the N frequency groups, respectively, to obtain N group calculation results.

A target frequency group is selected from the N frequency groups according to the N group calculation results, and the adjusted oscillation frequency is obtained from the target frequency group. That is, the weighted accumulation results are compared, and the frequency group having the maximum weighted accumulation result is determined by a determiner 207. Then, the frequency group having the maximum weighted accumulation result is utilized as the target frequency group, and the frequency $f_{ref}$ of the reference oscillation signal is adjusted to a central selected frequency of the target frequency group.

Figure 4B:
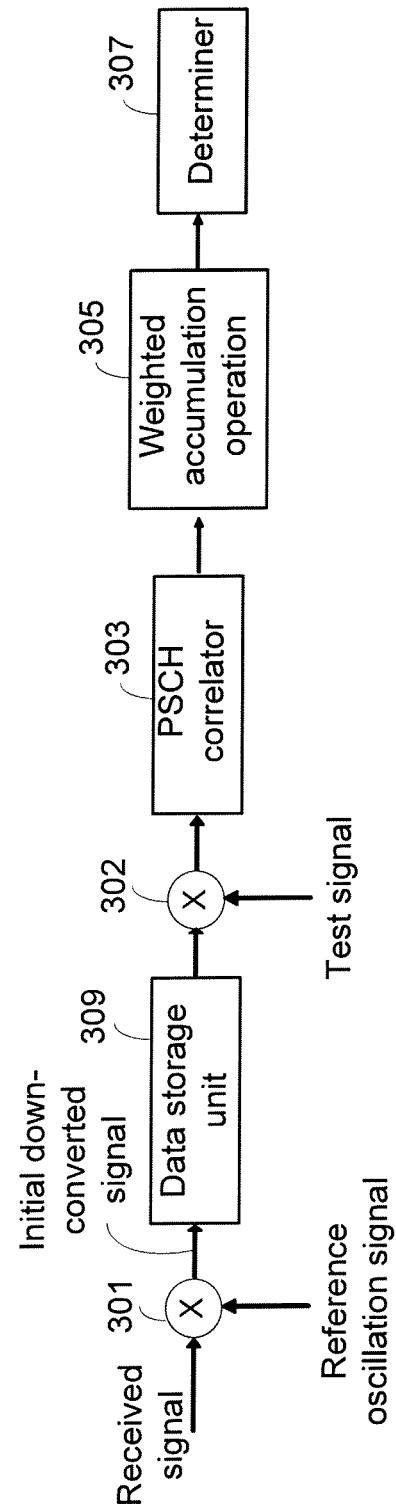
FIG. 4B is a schematic diagram of utilizing frequency groups as a basis for obtaining a coarse-tuned adjusted oscillation frequency by a second implementation approach according to the concept of the disclosure.

FIG. 4B shows a schematic diagram of utilizing frequency groups as a basis for obtaining a coarse-tuned adjusted oscillation frequency by a second implementation approach according to the concept of the disclosure. In this approach, a data storage unit 309 is further provided. The data storage unit 309 is for reducing a waiting time for receiving a signal as well as for lowering power consumption of an RF module.

The down-conversion in the second preferred embodiment is divided into two steps, which are respectively performed by a mixer 301 and a mixer 302.

A signal is down-converted by the mixer 301 according to an initial oscillation frequency to obtain an initial down-converted signal.

The initial down-converted signal is stored in the data storage unit 309. As the initial down-converted signal is stored, a second-stage of down-conversion can be performed on the initial down-converted signal by a test signal. Further, the initial down-converted signal is stored in a digital format in the data storage unit 309, so that a correlation calculation operation may be performed on the down-converted signal in a digital domain in a subsequent calculation.

That is to say, the mixer 302, a PSCH correlator 303, a weighted accumulation operation 305, and the determiner 307 are all operated in a digital domain.

Next, the initial down-converted signal is again down-converted according to M frequency differences between scan frequencies and the initial oscillation frequency (i.e., the scan frequency step is ±Δf, ±(2*Δf,), ... etc, for example, to obtain M down-converted signals.

Each time when the initial down-converted signal is down-converted by the test signal, the frequency of the test signal also changes as the frequency scan step differs. At this point, the data storage unit 309 is controlled to provide content of the previously stored initial down-converted signal.

More specifically, according to the change in the scan frequency $f_i$, the second implementation approach divides the down-conversion into two stages. In the first stage, the signal is directly down-converted according to the initial oscillation frequency; in the second stage, the initial down-converted signal is again down-converted according to the differences between the different scan frequencies and the initial oscillation frequency. Calculation results of the second-stage down-conversion are outputted to the PSCH correlator 303.

Details of the correlation calculation operation on the down-converted results are as those in the first method, and shall be omitted herein.

In short, in the second implementation approach, the signal is first down-converted according to the initial oscillation frequency $f_{orig}$. After the signal undergoes the first-stage down-conversion, the initial down-converted signal is stored, i.e., a plurality of WCDMA slot signals are recorded in a buffer provided by the data storage unit. That is, in the second implementation approach, the down-conversion, the PSCH correlation calculation operation, the weighted accumulation operation and the determination for frequency error of the scan signals are all performed in the digital domain, so that an overall processing speed is significantly improved.

Further, according to the record-and-play method adopted in the second implementation approach, when a reliable correlation result $y_i$ needs to use slots in the signal, the slots can be divided into multiple segments and further be respectively recorded and played. Moreover, the content stored in the buffer may also be updated by signals of other segments as the signal changes.

Taking a signal having 30 slots for example, the 30 slots can be divided into several segments in the second implementation approach. Signals of the segments are stored in the memory for repeated use. That is, by recording the signal in the buffer, the signal can be repeatedly played for different scan frequencies. Since the stored and down-converted signal is processed in the digital domain, the processing speed can be significantly increased.

It should be noted that, regardless whether the data storage is adopted, when selecting the scan frequencies and performing the corresponding correlation calculation operation, the two foregoing approaches select the scan frequencies from the M scan frequencies according to a predetermined sequence. For example, the predetermined sequence for arranging the scan frequencies is an incremental selection sequence, a decremental selection sequence, or an interleaved selection sequence.

An advantage of the interleaved selection sequence is that undesirable effects of channel variation upon the correlation calculation operation can be reduced, allowing the correlation results to be more accurate. For example, nine selected frequencies in a same frequency scan group can be selected in a sequence of F1, F5, F9, F2, F6, ..., F8.

As demonstrated by the above description, the method provided by the disclosure can be concluded into the following steps and flow.

Figure 5:
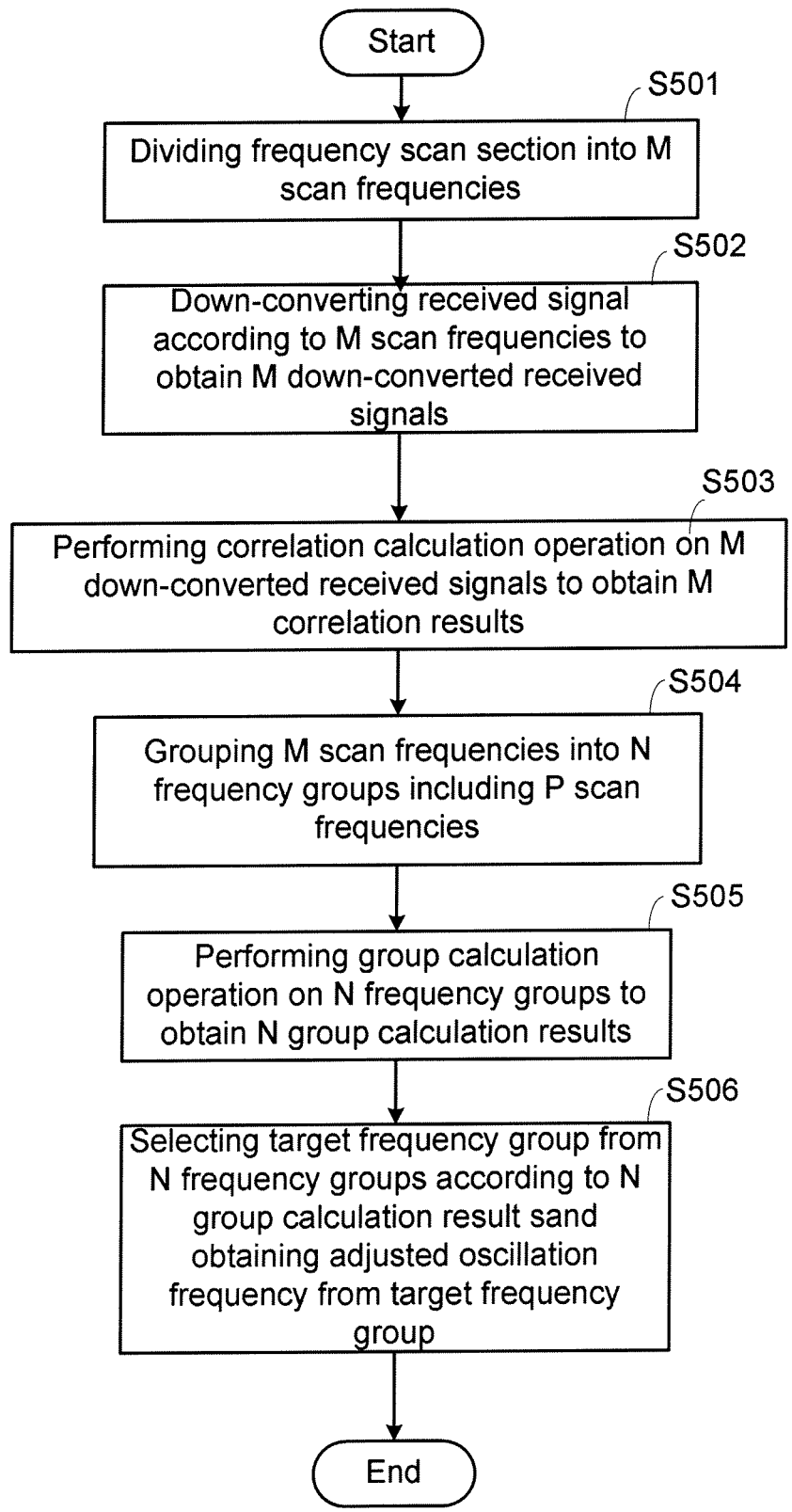
FIG. 5 is a flowchart of a frequency adjustment method according to one embodiment of the disclosure.

FIG. 5 shows a flowchart of a frequency adjustment method according to the concept of the disclosure. In the description below, M represents a quantity of scan frequencies in a frequency scan section, N represents a quantity of scanning groups, and P represents a quantity of selected frequencies included in each scanning group, where M=N+(P−1), and P>2.

Further, in any two consecutive frequency groups in the N frequency groups, the two consecutive frequency groups include the same (P−1) selected frequencies (scan frequencies). Taking FIG. 2 for example, each frequency group includes three selected frequencies, wherein the first frequency group G1 and the second frequency group G2 both include the second scan frequency f2 and the third scan frequency f2 in the frequency scan section.

In Step S501, the frequency scan section is first divided into M scan frequencies. That is, according to a frequency scan step Δf (e.g., 1.4 ppm), the frequency scan section is divided into the M scan frequencies. The frequency scan step Δf is defined according to a frequency adjustment range of a local oscillator.

An initial oscillation frequency $f_{orig}$ is regarded as a center of the frequency scan section, and the scan frequencies are selected at two ends of the initial oscillation frequency $f_{orig}$ according to integral multiples of the frequency scan step Δf. Therefore, the initial oscillation frequency $f_{orig}$ is an average of the frequency scan section. Further, M is an odd number, and the initial oscillation frequency $f_{orig}$ is an $((M+1)/2)^{th}$ scan frequency.

In Step S502, a signal is down-converted according to the M scan frequencies to obtain M down-converted signals. That is, one of the M scan frequencies is sequentially selected according to a predetermined sequence, with the selected scan frequency being utilized as a frequency of a reference oscillation signal, and the signal is down-converted by the reference oscillation signal to obtain the M down-converted signals. For example, the predetermined sequence is an incremental selection sequence, a decremental selection sequence, or an interleaved selection sequence.

In Step S503, a correlation calculation operation is performed on the M down-converted signals, respectively, to obtain M correlation results.

More specifically, in Step S503, a scan frequency for performing the down-conversion is selected from the scan frequencies according to a selection sequence, the receive signal is down-converted according to the selected scan frequency, and the correlation calculation operation is performed on the down-converted signal. It should be noted that, the predetermined sequence for selecting the scan frequencies may change, e.g., changing among an incremental selection sequence, a decremental selection sequence, and an interleaved selection sequence.

The interleaved selection sequence means that, when performing the correlation calculation operation, the scan frequency is selected in an interleaved manner. The interleaved selection sequence offers an advantage of significantly reducing interferences between signals.

Further, as previously described in the second implementation approach for implementing the frequency adjustment method of the disclosure, the second implementation approach is capable of enhancing the efficiency of frequency adjustment through recording the signal by a data storage unit. When adopting the second implementation approach, Step S503 comprises the following steps.

In Step S503, the signal is down-converted according to the initial oscillation frequency to obtain an initial down-converted signal, the initial down-converted signal is stored, and the initial down-converted signal is again down-converted according to M frequency differences between the scan frequencies and the initial oscillation frequency to obtain the M down-converted signals.

In Step S504, the M scan frequencies are grouped into N frequency groups each including P consecutive selected frequencies.

For the M scan frequencies, the scan frequencies respectively correspond to a correlation results, and so M correlation results are obtained.

For N frequency groups, a plurality of selected frequencies (e.g., nine selected frequencies) included in each frequency group $G_i$ correspond to different scan frequencies in the frequency scan section. These selected frequencies can be categorized into a central selected frequency and slave selected frequencies.

More specifically, in Step S504, the frequency groups are used as a unit for calculating the correlation results corresponding to the selected frequencies in each frequency group.

In Step S505, a group calculation operation is performed on the N frequency groups, respectively, to obtain N group calculation results.

More specifically, in Step S505, the frequency group on which the group calculation operation is to be performed is selected from the N frequency groups, P correlation results are selected from the M correlation results according to the target frequency group, a weighted accumulation operation is performed after sequentially corresponding P weightings to the selected P correlation results, and N weighted accumulation results corresponding to the N frequency groups are obtained by repeating the above steps of Step S505.

For example, for the selected frequencies of a same frequency group, a weighting corresponding to the correlation results $y_j$ of the selected frequencies in the frequency group respectively is assigned, and the weighted accumulation operation is performed. Before assigning the weightings, the quantity of the selected frequencies $F_k$ included in each frequency group should be first determined. Further, the weighting $w_k$ corresponding to the correlation result $y_k$ of the selected frequencies $F_k$ included in each frequency group can be determined according to a proportion function.

In Step S506, a target frequency group is selected from the N frequency groups according to the N group calculation results, and the adjusted oscillation frequency is obtained from the target frequency group.

More specifically, in Step S506, an extreme value (e.g., a maximum value of the group calculation results) is obtained by comparing the N group calculation results, the frequency group having the extreme value is selected as the target frequency group, and the adjusted oscillation frequency is obtained from the scan frequencies corresponding to the P selected frequencies included in the target frequency group.

When obtaining the adjusted oscillation frequency from the target frequency group, a central selected frequency is obtained from the P selected frequencies included in the target frequency group, and the scan frequency corresponding to the central selected frequency is utilized as the adjusted oscillation frequency for coarse correction.

When P is an odd number, the central selected frequency is the scan frequency corresponding to the $((P+1)/2)^{th}$ in the target frequency group; when P is an even number, the central selected frequency is an average of the scan frequencies corresponding to the $(P/2)^{th}$ selected frequency and the $((P+2)+1)^{th}$ selected frequency.

According to the concept of the disclosure, 256 chips in the PSCH sequence can be fully employed in the process of frequency coarse tuning. Therefore, even under non-ideal channel conditions, the method of the disclosure ensures a satisfactory stability.

As illustrated, a concept of utilizing the frequency groups for determining an extreme value is provided. Such method prevents a situation that a single scan frequency is easily affected by noises and interferences. Further, simulation results have shown that the concept of the disclosure provides a preferred detection rate.

Further, as observed from the preferred embodiment of the disclosure, when a data storage unit is provided, a signal can be first down-converted by a reference oscillation signal having an initial oscillation frequency $f_{orig}$, with the initial down-converted signal then being stored in the data storage unit, so that a processing speed is significantly increased when performing the subsequent down-conversion using a test signal.

Further, the P weightings corresponding to the correlation results of the scan frequencies in each frequency group can be determined through a proportion function. For example, the proportion function indicated by Equation (6) represents a ratio β:

$$\beta = |\int_T s(t-t_b) \times s^*(t-t_b) \exp(j2\pi(f_i - f_{i+n})t)dt|/|\int_T s(t-t_b) \times s^*(t-t_b)dt| \quad \text{Equation (6)}$$

Figure 6:
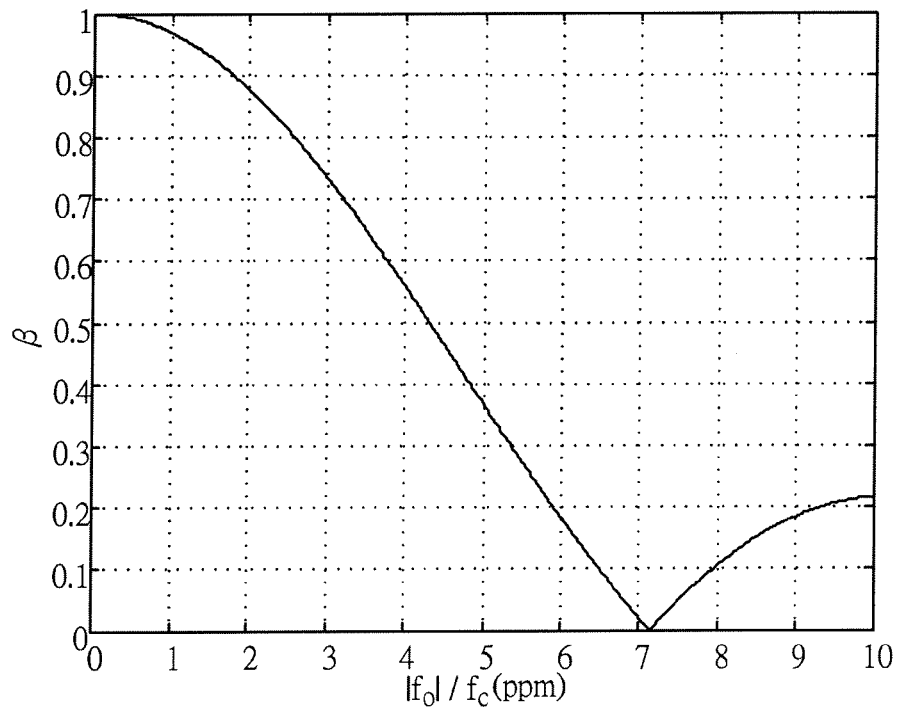
FIG. 6 is a schematic diagram of a proportion function for changing a weighting distribution for the frequency groups.

FIG. 6 shows a schematic diagram of a proportion function for changing a weighting distribution for the frequency groups. It should be noted that, although the weighted calculation weightings for the weighted accumulation operation can be determined by the ratio β, definitions for the proportion function of the ratio β are not limited to Equation (6). Equation (7) shows another example of the proportion function.

$$\beta = |\int_T s(t-t_b) \times s^*(t-t_b) \exp(j2\pi(f_i - f_{i+n})t)dt|^2/|\int_T s(t-t_b) \times s^*(t-t_b)dt|^2 \quad \text{Equation (7)}$$

Further, when α(t) can be obtained through estimation, calculation or prediction, α(t) may also be included in the proportion function, as in Equation (8) and Equation (9):

$$\beta = |\int_T \alpha(t)s(t-t_b) \times s^*(t-t_b) \exp(j2\pi(f_i - f_{i+n})t)dt|/|\int_T \alpha(t)s(t-t_b) \times s^*(t-t_b)dt| \quad \text{Equation (8)}$$

$$\beta = |\int_T \alpha(t)s(t-t_b) \times s^*(t-t_b) \exp(j2\pi(f_i - f_{i+n})t)dt|^2/|\int_T \alpha(t)s(t-t_d) \times s^*(t-t_d)dt|^2 \quad \text{Equation (9)}$$

In addition to determining the weighted calculation weightings corresponding to the correlation results according to the proportion function, the weighted calculation weightings corresponding to the selected frequencies may also be adjusted according to actual system design requirements. For example, 1 is used as the weighted calculation weightings, or a greater weighted calculation weighting can be assigned for a selected frequency of a particular selection sequence.

It is known from 3GPP TS 34.12 specifications that, when measuring performance in a multi-path fading environment, the test can be carried out according to a propagation condition. Six stereotypic situations are defined in the Table D.2.2.1 on page 493 of the specifications.

Figure 7A:
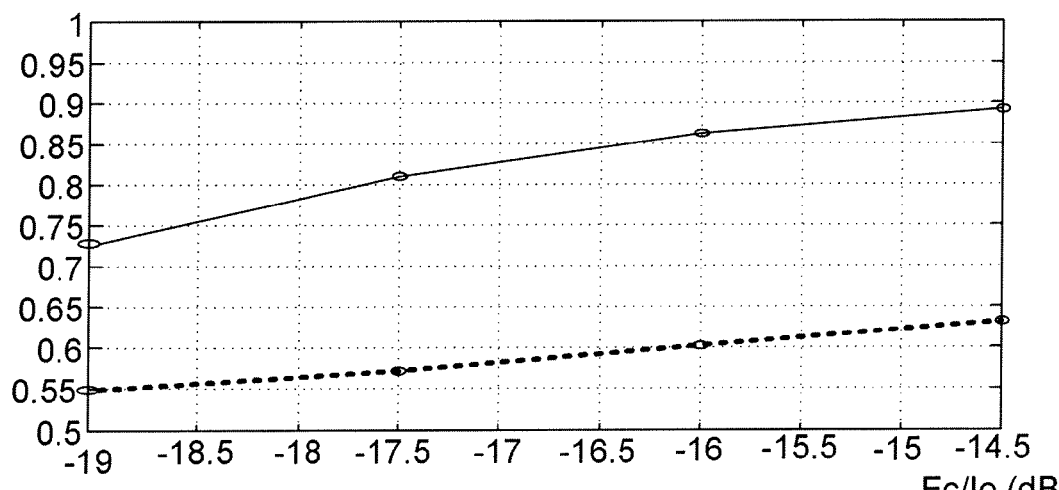
FIG. 7A is a schematic diagram of comparing performances of implementing a conventional solution and the present disclosure to a first situation defined in the Table D.2.2.1 in the 3GPP TS 34.12 specification.
Figure 7B:
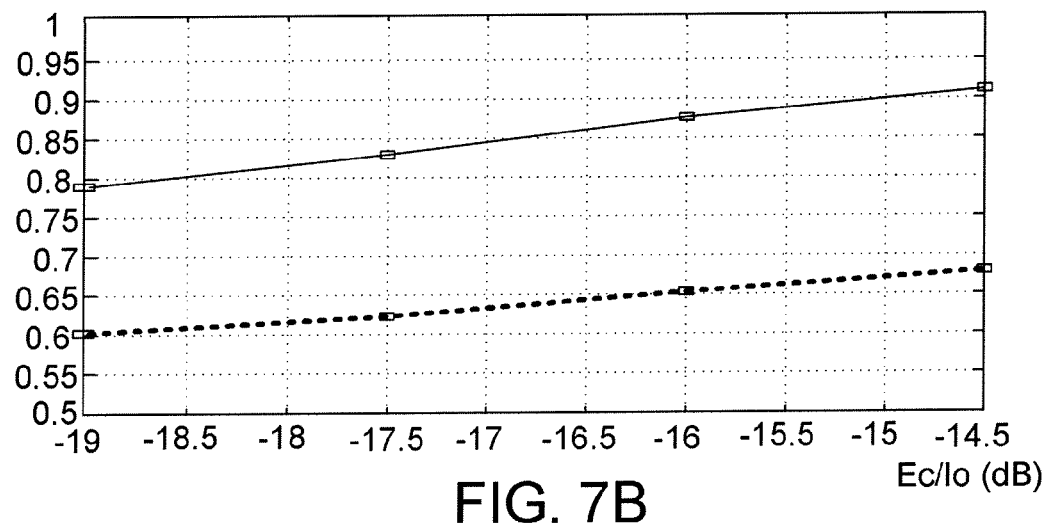
FIG. 7B a schematic diagram of comparing performances of implementing a conventional solution and the present disclosure to a second situation defined in the Table D.2.2.1 in the 3GPP TS 34.12 specification.
Figure 7C:
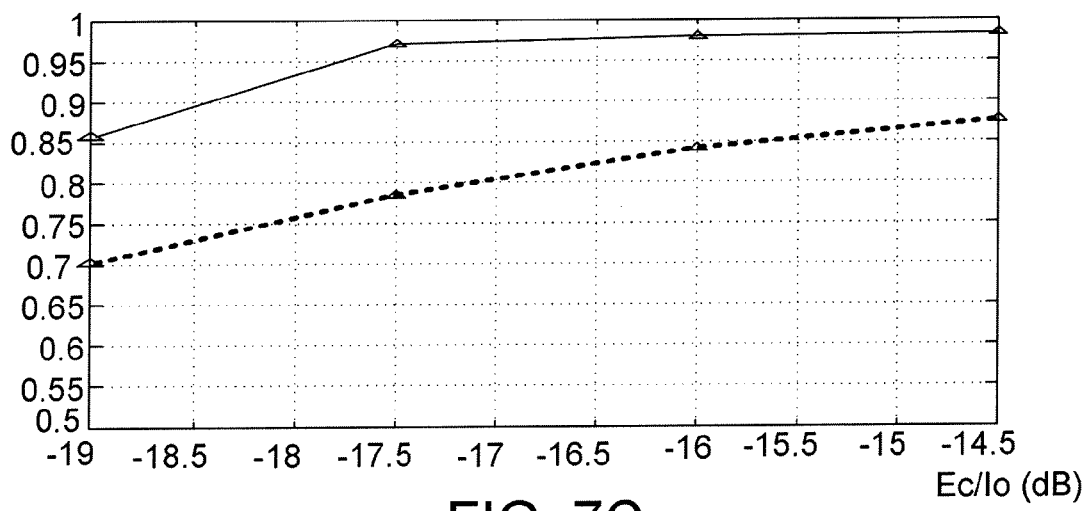
FIG. 7C a schematic diagram of comparing performances of implementing a conventional solution and the present disclosure to a third situation defined in the Table D.2.2.1 in the 3GPP TS 34.12 specification.

FIGS. 7A to 7C respectively illustrate first three situations of the six situations, and performance is respectively measured by a conventional solution and the method of the disclosure. Test comparison results of other situations are similar, and shall be omitted herein. In these diagrams, a transmission power lo is substantially equal to a sum (lo=lor+loc) of an actual transmission power lor and a noise power loc. For different channels, lor represents a ratio occupied by the power, inferring that a value of lor may change as the channel differs.

In the diagrams, a horizontal axis represents a transmission power (Ec/lo), and a vertical axis represents a detection rate for an error frequency $f_{error}$ being smaller than a frequency scan step $\Delta f$ (1.4 ppm).

FIG. 7A shows a schematic diagram of comparing performances of implementing a conventional solution and the present disclosure to the first situation defined in the Table D.2.2.1 in the 3GPP TS 34.12 specification.

In the first situation, speeds of a first band (Band I), a second band (Band II) and a third band (Band III) are all 3 km/h, whereas speeds of a fifth band (Band V) and a sixth band (Band VI) are 7 km/h. Signals of two paths are included, and have different average powers. One of the paths has a relative mean power of 0 dB and a relative delay of 0 ns; whereas the other path has a relative mean power of −10 dB and a relative delay of 976 ns.

In FIG. 7A, a solid line represents a calculation result by using a maximum weighted accumulation result according to the disclosure, and a dotted line represents a result by using a maximum correlation result according to a conventional solution. At a same position on the horizontal axis, positions of the points of the solid line representing the present disclosure are higher at the vertical axis than those of the dotted line representing the conventional solution. Therefore, it is apparent that, given the transmission power is the same, the estimation performed by the adjusted oscillation frequency according to the approach of the frequency groups renders a preferred detection rate.

FIG. 7B shows a schematic diagram of comparing performances of implementing a conventional solution and the present disclosure to the second situation defined in the Table D.2.2.1 in the 3GPP TS 34.12 specification.

In the second situation, the bands (Bands I to VI) have same conditions as the first multi-channel situation, and signal of three paths are included. The three paths have a same mean power of 0 dB. The first path has a relative delay of 0 ns, the second path has a relative delay of 976 ns, and the third path has a relative delay of 20000 ns.

In FIG. 7B, a solid line also represents a calculation result by using a maximum weighted accumulation result according to the disclosure, and a dotted line represents a result by using a maximum correlation result according to a conventional solution. Under a same transmission power (when a position on the horizontal axis is the same), positions of the points of the solid line on the vertical axis are higher than those of the dotted line, inferring that the detection rate represented by the solid line has a preferred detection rate over the dotted line.

FIG. 7C shows a schematic diagram of comparing performances of implementing a conventional solution and the present disclosure to the third situation defined in the Table D.2.2.1 in the 3GPP TS 34.12 specification.

The third multi-channel situation is substantially a situation where a user is in a fast-moving condition. Therefore, the speeds of the first band (Band I), the second band (Band II) and the third band (Band III) are all 120 km/h; whereas the speeds of the fifth band (Band V) and the sixth band (Band VI) are 282 km/h. Signals of four paths are included.

The first path has a relative mean power of 0 dB and a relative delay of 0 ns, the second path has a relative mean power of −3 dB and a relative delay of 260 ns, the third path has a relative mean power of −6 dB and a relative delay of 521 ns, and the fourth path has a mean power of −9 dB and a relative delay of 781 ns.

Similarly, in FIG. 7C, a solid line also represents a calculation result by using a maximum weighted accumulation result according to the disclosure, and a dotted line represents a result by using a maximum correlation result according to a conventional solution. For the same positions on the horizontal axis, positions of the points of the solid line on the vertical axis are higher than those of the dotted line. Thus, under a same transmission power, the detection rate represented by the solid line has a preferred detection rate over the dotted line.

In conclusion, the diagrams illustrate the detection rate for different transmission powers according to three multi-channel path fading situations defined by Table D.2.2.1 in the 3GPP TS 34.12 specifications, and differences between a conventional solution and the present disclosure.

In the diagrams, the points closer to the right indicate being transmitted by higher transmission powers. It is also observed from the diagrams, the points closer to the right (corresponding to higher transmission powers) have a higher detection rate compared to the points on the left (corresponding to lower transmission powers). That is, the detection rate is least satisfactory when the transmission power is −19 dB, second least satisfactory when the transmission power is −17.5 dB, and most satisfactory when the transmission power is −14.5 dB.

It is also seen from FIGS. 7A to 7C that, the comparison performed on the maximum weighted accumulation results of the present disclosure offer preferred detection rates than the comparison performed on the maximum correlation result by a conventional solution. That is to say, given that signals are transmitted under the condition of a same power, the present disclosure offers a method that more accurately estimates the adjusted oscillation frequency.

It should be noted that, although the primary synchronization sequence of a WCMDA system is taken as an illustrative example for frequency correction in the description of the disclosure, the concept of the disclosure is not limited to applications of a WCDMA system.

The concept of the disclosure is suitable to an application where a signal s(t) is a signal having a sequence with an auto-correlation property. Therefore, the concept of the disclosure is also applicable to other types of communication systems.

For example, a digital television transmits signals through quadrature phase shift keying (QPSK). Such modulation approach also first needs to perform frequency correction before correctly transmitting digital television signals. Alternatively, frequency correction for communications of other types of cell phones may also be performed according to the concept of the disclosure.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A frequency adjustment method, applied to a reference oscillation signal, the method comprising:
    dividing a frequency scan section into M scan frequencies, wherein M is a positive integer greater than 1;
    down-converting a signal according to the M scan frequencies to obtain M down-converted signals;
    performing a correlation calculation operation on the M down-converted signals, respectively, to obtain M correlation results;
    grouping the M scan frequencies into N frequency groups, wherein N is a positive integer greater than 1, performing a group calculation operation on the N frequency groups, respectively, to obtain N group calculation results; and
    selecting a target frequency group from the N frequency groups according to the N group calculation results, and obtaining an adjusted oscillation frequency from the target frequency group,
    wherein each frequency group comprising P selected frequencies, wherein P is a positive integer greater than 1, corresponding to P consecutive scan frequencies in the frequency scan section, wherein every two consecutive frequency groups in the N frequency groups comprise same (P−1) selected frequencies,
    wherein the step of performing the group calculation operation on the N frequency groups, respectively, to obtain the N group calculation results comprises:
    selecting the frequency group on which the group calculation operation is to be performed from the N frequency groups;
    selecting P correlation results from the M correlation results according to the target frequency group;
    sequentially corresponding P weightings to the selected P correlation results, and performing a weighted accumulation operation on the selected P correlation results; and
    repeating the above steps to obtain the N group calculation results corresponding to the N frequency groups.

2. The method according to claim 1, wherein M is an odd number.

3. The method according to claim 1, wherein M=N+(P−1), and P is greater than 2.

4. The method according to claim 1, wherein the step of dividing the frequency scan section into the M scan frequencies divides the frequency scan section into the M scan frequencies according to a frequency scan step.

5. The method according to claim 1, wherein the step of down-converting the signal according to the M scan frequencies to obtain the M down-converted signals comprises:
    sequentially selecting one of the M scan frequencies according to a predetermined sequence and utilizing the selected scan frequency as a frequency of the reference oscillation signal; and
    down-converting the signal by the reference oscillation signal to obtain the M down-converted received signals.

6. The method according to claim 5, wherein the predetermined sequence is an incremental selection sequence, a decremental selection sequence or an interleaved selection sequence.

7. The method according to claim 1, wherein the P correlation results are selected from the P selected frequencies in the target frequency group.

8. The method according to claim 1, wherein the P weightings are determined according to a proportion function.

9. The method according to claim 1, wherein the step of selecting the target frequency group from the N frequency groups according to the N group calculation results, and obtaining the adjusted oscillation frequency from the target frequency group comprises:
    obtaining an extreme value according to a comparison on the N group calculation results;
    selecting the frequency group having the extreme value to be the target frequency group; and
    obtaining the adjusted oscillation frequency from the P selected frequencies in the target frequency group.

10. The method according to claim 9, wherein the extreme value is a maximum value of the group calculation results.

11. The method according to claim 9, wherein the step of obtaining the adjusted oscillation frequency from the P selected frequencies in the target frequency group obtains a central selected frequency according to the P selected frequencies and utilizing the central selected frequency as the adjusted oscillation frequency.

12. The method according to claim 11, wherein:
    when P is an odd number, the central selected frequency is the scan frequency corresponding to a $((P+1)/2)^{th}$ selected frequency in the target frequency group; and
    when P is an even number, the central selected frequency is an average of the scan frequencies corresponding to a $(P/2)^{th}$ selected frequency and a $((P+2)+1)^{th}$ selected frequency.

13. The method according to claim 1, wherein the step of down-converting the signal according to the M scan frequencies to obtain the M down-converted received signals comprises:
    down-converting the signal according to an initial oscillation frequency to obtain an initial down-converted signal;
    storing the initial down-converted signal; and
    down-converting the initial down-converted signal according to M frequency differences between the scan frequencies and the initial oscillation frequency, respectively, to obtain the M down-converted received frequencies.

14. The method according to claim 13, wherein the initial frequency is an $((M+1/2)^{th}$ frequency scan section.

15. The method according to claim 13, wherein the initial oscillation frequency is an average value of the frequency scan section.

* * * * *